United States Patent
Norström et al.

(10) Patent No.: US 6,690,080 B2
(45) Date of Patent: Feb. 10, 2004

(54) SEMICONDUCTOR STRUCTURE FOR ISOLATION OF SEMICONDUCTOR DEVICES

(75) Inventors: Hans Norström, Solna (SE); Carl Björmander, Sundbyberg (SE); Ted Johansson, Djursholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/119,047

(22) Filed: Apr. 10, 2002

(65) Prior Publication Data

US 2002/0109140 A1 Aug. 15, 2002

Related U.S. Application Data

(62) Division of application No. 09/662,842, filed on Sep. 15, 2000, now Pat. No. 6,413,835.

(30) Foreign Application Priority Data

Sep. 17, 1999 (SE) ............................................. 9903338
Jan. 28, 2000 (SE) ............................................. 0000296

(51) Int. Cl.[7] .............................................. H01L 29/00
(52) U.S. Cl. ..................... 257/499; 257/301; 257/302; 257/303; 257/304; 257/305; 257/506
(58) Field of Search ................................ 257/301–305, 257/499, 506

(56) References Cited

U.S. PATENT DOCUMENTS

| | | | | |
|---|---|---|---|---|
| 4,801,988 A | * | 1/1989 | Kenney ........................ 257/304 |
| 4,994,406 A | | 2/1991 | Vasquez et al. | |
| 5,015,594 A | * | 5/1991 | Chu et al. .................... 438/207 |
| 5,691,232 A | | 11/1997 | Bashir et al. | |
| 5,895,253 A | | 4/1999 | Akram | |
| 5,945,704 A | * | 8/1999 | Schrems et al. ............. 257/301 |
| 6,063,658 A | * | 5/2000 | Horak et al. ................. 438/248 |
| 6,121,651 A | * | 9/2000 | Furukawa et al. ........... 257/296 |
| 6,140,175 A | * | 10/2000 | Kleinhenz et al. ........... 438/243 |
| 6,150,686 A | * | 11/2000 | Sugiura et al. .............. 257/301 |
| 6,204,140 B1 | * | 3/2001 | Gruening et al. ............ 438/386 |
| 6,236,079 B1 | * | 5/2001 | Nitayama et al. ............ 257/306 |
| 6,291,286 B1 | * | 9/2001 | Hsiao .......................... 438/238 |
| 6,552,378 B1 | * | 4/2003 | Hoenigschmid et al. .... 257/296 |
| 2001/0038113 A1 | * | 11/2001 | Bronner et al. ............. 257/301 |
| 2002/0167050 A1 | * | 11/2002 | Brown et al. ................ 257/347 |

FOREIGN PATENT DOCUMENTS

WO WO97/35344 9/1997

OTHER PUBLICATIONS

S. Wolf, "Silicon Processing for the VLSI ERA, vol. 2—Process integration", Chapter 2, Lattice Press, Sunset Beach, CA, 1990.
L. Peters, "Choices and Challenges for Shallow Trench Isolation"; Semiconductor International, Apr. 1999, p. 69.
C.Y. Chang et al., "ULSI Technology", McGraw-Hill, New York, 1996, pp. 355–357.

* cited by examiner

Primary Examiner—Amir Zarabian
Assistant Examiner—Ida M. Soward
(74) Attorney, Agent, or Firm—Burns, Doane, Swecker & Mathis, L.L.P.

(57) ABSTRACT

In an integrated circuit, particularly an integrated circuit for radio frequency applications, a semiconductor structure for isolation of semiconductor devices that includes a semiconductor substrate, at least one shallow trench extending vertically into the substrate, a deep trench laterally located within the shallow trench, where the deep trench extends vertically further into the substrate. The deep trench is self aligned to the shallow trench with a controlled lateral distance between an edge of the shallow trench and an edge of the deep trench and the lateral extensions of the shallow and deep trenches, respectively, are independently chosen.

20 Claims, 8 Drawing Sheets

SEMICONDUCTOR STRUCTURE FOR ISOLATION OF SEMICONDUCTOR DEVICES

This application is a division of Application No. 09/662,842, filed on Sep. 15, 2000 now U.S. Pat. No. 6,413,835 which claimed priority under 35 U.S.C. §§119 and/or 365 to 9903338-3 and 0000296-4 filed in Sweden on Sep. 17, 1999 and Jan. 28, 2000, respectively; the entire content of which is hereby incorporated by reference.

TECHNICAL FIELD OF THE INVENTION

The present invention generally relates to the isolation of semiconductor devices in integrated circuits by using isolation structures, thus enabling increase of the packing density and isolation.

More specifically, the invention relates to a method for fabrication of a semiconductor structure comprising a shallow isolation region and a deep trench isolation region, to the semiconductor structure itself, and to an integrated circuit comprising such a semiconductor structure.

DESCRIPTION OF RELATED ART

All non-trivial integrated electronics involves connecting isolated devices through specific electrical connection paths. The device isolation scheme is therefore one of the critical parts when fabricating integrated circuits. Many different schemes have been developed during the years. Parameters like minimum isolation spacing, surface planarity, defect density, process complexity and electrical properties, i.e. DC and high frequency properties, influence the choice of a scheme for the particular application and process technology. Mesa isolation, junction isolation and LOCOS (local oxidation of silicon) isolation are common techniques in use, see e.g. Chapter 2 in S. Wolf, "Silicon Processing for the VLSI ERA, Volume 2—Process integration", Lattice Press, Sunset Beach, 1990.

As feature sizes in modern, high-complexity integrated circuits (ULSI, ultra large scale integration) decreases, there is a need to reduce shortcomings, such as packing density, leakage currents and latch-up between devices, associated with older isolation technologies. Shallow and deep trench isolations have therefore become very popular. Although demanding on the etching and refilling process steps, they offer vast improvement in decreased area needed for the isolation between circuit elements and e.g. storage capacitors in DRAM memory technologies.

The trenches are formed by removing silicon by dry etching and filling them with suitable dielectric or conductive materials. Shallow trench isolation (STI), which is used to replace LOCOS isolation, usually has a depth of a few tenths of a micron and is used for isolation between device elements. Shallow trench isolation is closer described in e.g. "Choices and Challenges for Shallow Trench Isolation", Semiconductor International, April 1999, p. 69. Deep trenches, usually with a depth larger than a couple of microns, are mainly used to isolate different devices and device groups (wells) in CMOS/BiCMOS technology, to form vertical capacitors and to form high-conductive contacts to the substrate, see C. Y. Chang and S. M. Sze (Eds); "ULSI Technology", McGraw-Hill, New York, 1996, pp. 355–357 and WO 97/35344 (inventors: Jarstad and Norstrom). The trenches are filled with oxide, polysilicon or other materials, and the surface is planarized, either by dry etching of by chemical mechanical polishing (CMP).

In U.S. Pat. No. 4,994,406 issued to Vasquez and Zoebel is described a method to form shallow and self-aligned deep isolation trenches on an integrated circuit. Although the deep trench are being self-aligned to the edge of the device areas, the structure uses a polysilicon nitride stack to form device isolation using LOCOS, with large lateral encroachment, high temperature budget, and a non-planar surface as a result.

U.S. Pat. No. 5,691,232 issued to Bashir discloses a method to form shallow and deep trench isolation by combining the formation of the two. First, a shallow trench is formed using a first mask, and then a deep trench is formed using a second mask. The whole structure is filled with oxide and planarized. Since the mask for the deep trench must be aligned against the mask for the shallow trench, less packing density is achieved and/or leakage current problems will occur when the structure is scaled. Also, filling of narrow deep trenches usually requires the use of polysilicon and back etching, not included in this description.

In U.S. Pat. No. 5,895,253 issued to Akram is described a method to form a deep trench within a shallow trench and how to fill it with an insulator. The deep trench is self-aligned within the shallow trench. This is made with only one mask step. After forming the trench, it is filled in a common way. Although the patent teaches how to place a deep trench self-aligned within the shallow trench, the method uses only one mask step, and it will not be possible to use shallow trenches without any deep trench. The width of the deep trench is set by the width of the shallow trench opening and spacer widths. If different shallow trench openings are used, the etching and filling of the deep trenches will become difficult or even impossible.

SUMMARY OF THE INVENTION

It is consequently an object of the present invention to provide a method in the fabrication of an integrated circuit, particularly an integrated circuit for radio frequency applications, for forming shallow and deep trenches for isolation of semiconductor devices comprised in said circuit, while overcoming at least some of the problems associated with the prior art.

It is a further object of the invention to provide a fabrication method that permits deep trenches to be placed inside shallow trench regions, with adjustable distance from the edge of the shallow trench to the deep trench, still allowing the formation of shallow trench areas without any deep trenches inside.

It is yet a further object of the invention to provide such a method having enhanced scalability characteristics enabling an increased packing density.

It is still a further object of the invention to provide such a method having increased integration flexibility and which is compatible with several technologies.

These objects among others are, according to one aspect of the invention, fulfilled by a method comprising the following steps:

providing a semiconductor substrate;

optionally forming a first dielectric layer on said substrate;

forming at least one shallow trench in said first dielectric layer or in said substrate by using a first mask formed on said first dielectric layer, said shallow trench extending into said substrate;

forming a second dielectric layer of a predetermined thickness, 2x, on the structure obtained subsequent to the step of forming the at least one shallow trench;

forming at least one opening in said second dielectric layer by using a second mask formed on said second dielectric layer and with an edge of said second mask aligned to an edge of said shallow trench with a maximum misalignment of half the predetermined thickness of said second dielectric layer, i.e. +/− x, said opening extending within the shallow trench to the bottom thereof, whereby a spacer of a width equal to the predetermined thickness, 2x, is formed in said shallow trench and along said edge thereof; and forming a deep trench in said opening by using said second dielectric layer as a hard mask, said deep trench extending further into said substrate and being self-aligned to said shallow trench.

Furthermore it is an object of the present invention to provide a semiconductor structure resulting from above said fabrication method.

According to a second aspect of the present invention there is thus provided a semiconductor structure comprising a semiconductor substrate; at least one shallow trench extending vertically into said substrate; a deep trench laterally within said shallow trench, said deep trench extending vertically further into said substrate, wherein said deep trench is self-aligned to said shallow trench with a controlled lateral distance between an edge of the shallow trench and an edge of the deep trench, and the lateral extensions of the shallow and deep trenches, respectively, are independently chosen.

An advantage of the present invention is that the distance between the deep and shallow trench edges is fixed and determined by the thickness of the deposited second dielectric layer, thus easily controllable.

Another advantage of the invention is that the distance between the deep and shallow trench edges is minimized in order to obtain an increased packing density of the integrated circuit, still providing a step between them in order to prevent stress arising from deep trench processing to interfere with active areas.

Further advantages and characteristics of the present invention will be disclosed in the following detailed description of embodiments.

BRIEF DESCRIPTION OF THE DRAWINGS

The present invention will become more fully understood from the detailed description of embodiments of the present invention given hereinbelow and the accompanying FIGS. 1–11 which are given by way of illustration only, and thus are not limitative of the invention.

DETAILED DESCRIPTION OF EMBODIMENTS

In the following description, for purposes of explanation and not limitation, specific details are set fourth, such as particular hardware, applications, techniques, etc. in order to provide a thorough understanding of the present invention. However, it will be apparent to one skilled in the art that the present invention may be practiced in other embodiments that depart from these specific details. In other instances, detailed descriptions of well-known methods, protocols, devices, and circuits are omitted so as not to obscure the description of the present invention with unnecessary details.

With reference to FIGS. 1–11 an inventive embodiment of a process sequence, which includes formation of shallow and deep trenches, filling of the trenches and planarization, is described in detail.

Prior to formation of isolation, sub-collectors, wells or any other device regions may have been formed in the starting material. However, at the stage where the present inventive process is to be started, the surface of a silicon substrate is clean and any layers on top of the silicon have been removed.

Figure 1:
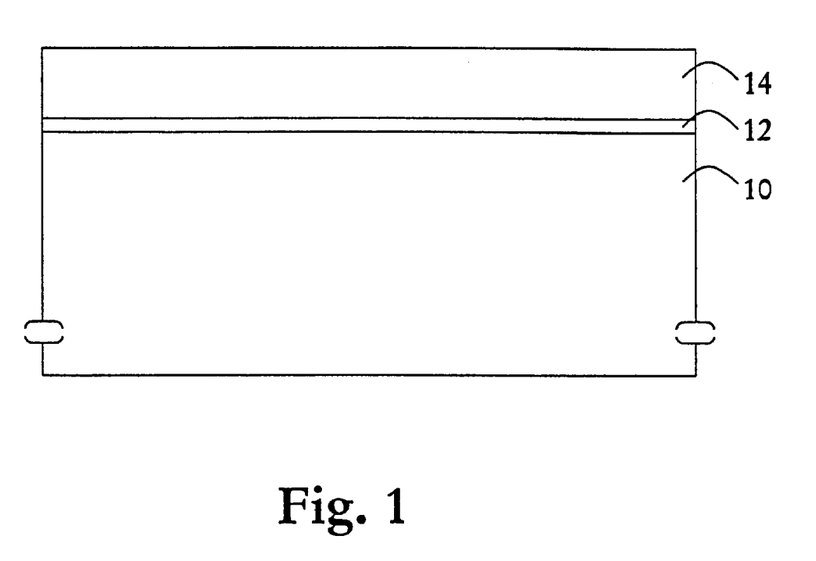
FIGS. 1–3 and 5–8 are highly enlarged cross-sectional views of a portion of a semiconductor structure during processing according to the present invention.

With reference to FIG. 1 the formation of a hard mask for a shallow trench is described. The masking layer for the shallow trench is formed by oxidizing silicon surface 10 to form a layer 12 of thermal silicon dioxide of typically 100 Å thickness. Next, an approximately 2000 Å thick silicon nitride layer 14 is deposited by chemical vapor deposition (CVD). Other combinations of thicknesses and/or masking materials are possible.

Figure 2:
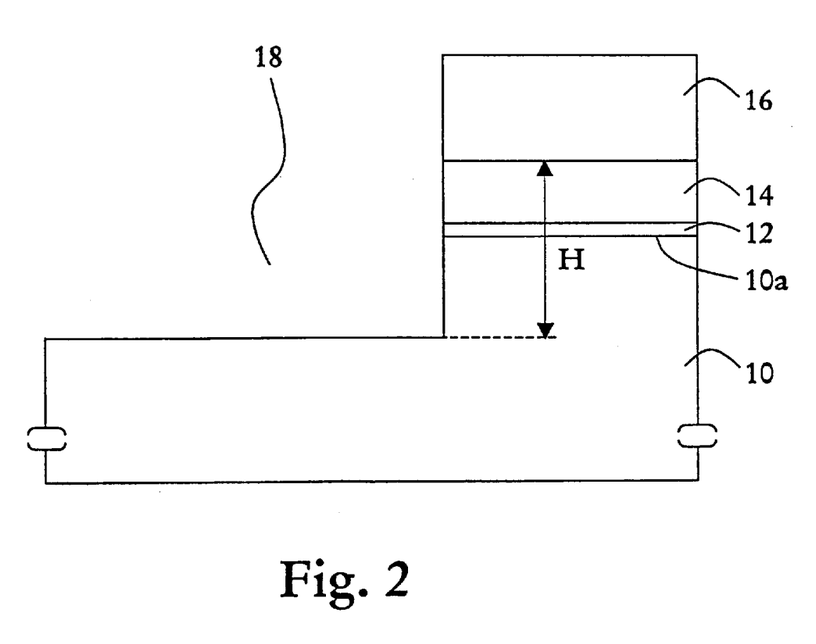

With reference next to FIG. 2, the formation of a shallow trench is considered. A photo resist 16 is applied on the nitride layer 14, and is exposed using a first mask, so called moat mask, which leaves openings where the shallow trench is to be etched. The etching, which preferably is non-isotropic, is performed by reactive ion etching (RIE), through the nitride/oxide layers 12,14 and into the silicon substrate 10 to form a vertical shallow trench 18. The preferred depth of trench 18 is 0.2–0.7 μm, or more typically 0.3–0.6 μm, from the silicon surface 10a. The photo resist 16 is removed subsequent to the etching of the shallow trench 18.

Figure 3:
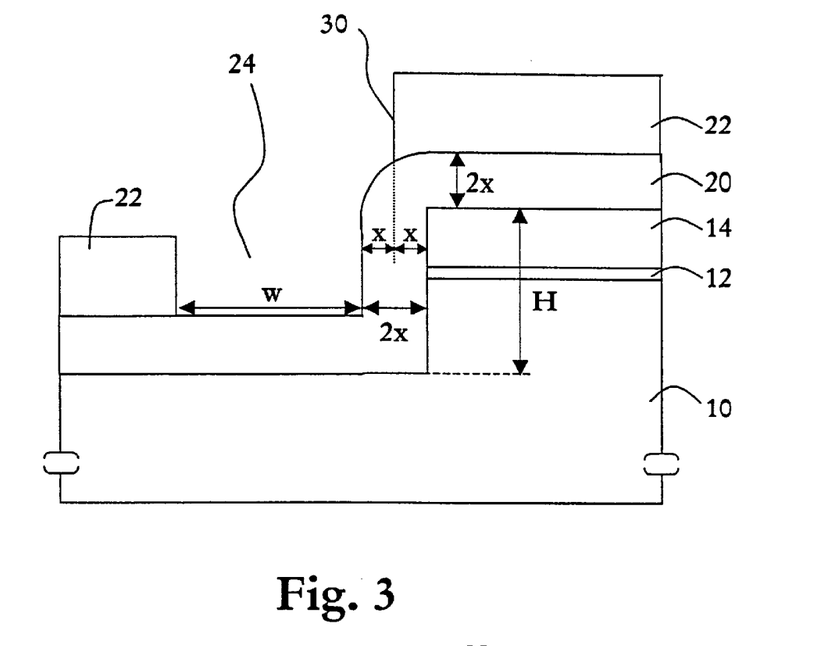
Figure 4:
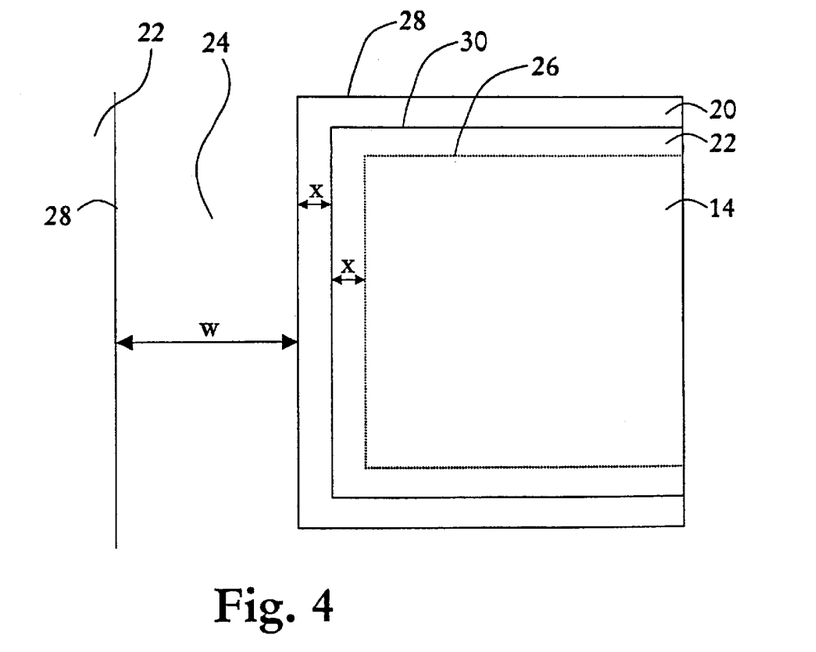
FIG. 4 is a view from above of a portion of a semiconductor structure during processing according to the present invention.

With reference next to FIGS. 3 and 4 the formation of a hard mask for a deep trench is described.

A silicon oxide layer 20 of thickness 2x is deposited, preferably conformly, e.g. by CVD, on top of the structure, i.e. remaining portions of the nitride layer 14 and in the shallow trench 18. It is preferred that the oxide layer 20 is deposited conformly as otherwise margins for subsequent masking and etching will be reduced. Photo resist 22 is applied, and is exposed using a second mask, so called trench mask, which, together with portion of oxide layer 20, define an opening 24 with a width w for the deep trench.

The layouts of the first and second masks, respectively, are illustrated in FIG. 4, which shows the semiconductor structure from above. The edges of the shallow trench and of the opening that will constitute the lateral definition of the deep trench are indicated by 26 and 28, respectively.

The opening(s) of the trench mask may be placed anywhere inside the shallow trench regions. The width of the deep trench can be chosen by using different mask dimensions. It is usually preferred to use trenches of fixed lateral dimensions (thicknesses), preferably of about 1 μm or less, as problems otherwise will occur with a non-uniform etch and difficulties to refill and planarize the deep trench.

One feature of the present invention is the alignment of the mask edge 30 to the shallow trench edge 26, which makes it possible to place the deep trench self-aligned with a distance set by the oxide thickness 2x, which in a preferred example is between 1000 and 4000 Å, and typically 2500 Å.

Preferably, the height H of shallow trench 18, oxide layer 12 and nitride layer 14 (i.e. the total etching depth when forming shallow trench 18) and the thickness 2x of silicon oxide layer 20 fulfill the following relation:

$$H > 2x$$

In FIGS. 3 and 4 are shown the details of the mask alignment and the oxide thickness. Assuming that the oxide is 100% conform (uniform in thickness at steps) with a thickness of 2x, the trench mask 30 is positioned with an overlap x from the silicon nitride edge 26, which position was given by the moat mask. A modern stepper can align the mask with a precision better, or even much better, than 1000 Å.

Figure 5:
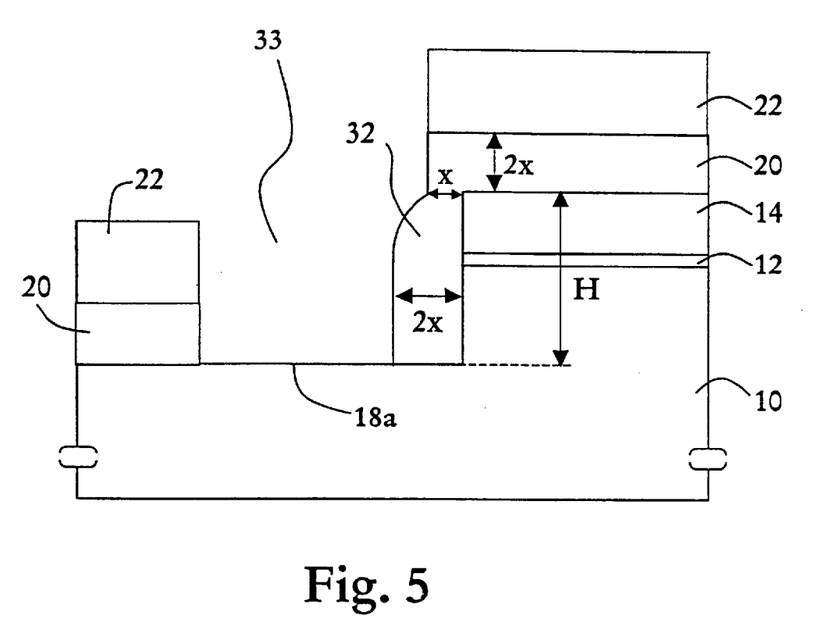

Next with reference to FIG. 5 the formation of an oxide spacer 32, is considered. The oxide layer 20 is etched by reactive-ion etching (RIE) to define the trench opening 33 extending to the bottom surface 18a of the shallow trench. Simultaneously, sidewall oxide spacer 32 at the shallow trench edge is formed of portion of layer 20, which has a width of 2x. By controlling the oxide thickness 2x, the distance from the shallow trench edge to the deep trench opening can be adjusted. On top of the nitride layer 14, the oxide layer 20 is protected by the photo resist mask, and this oxide will later serve as a hard mask for these areas during the following etch step. The oxide layer 20 also is retained at portions of the shallow trench area, where no deep trenches will be formed. After etching the photo resist is removed.

Figure 6:
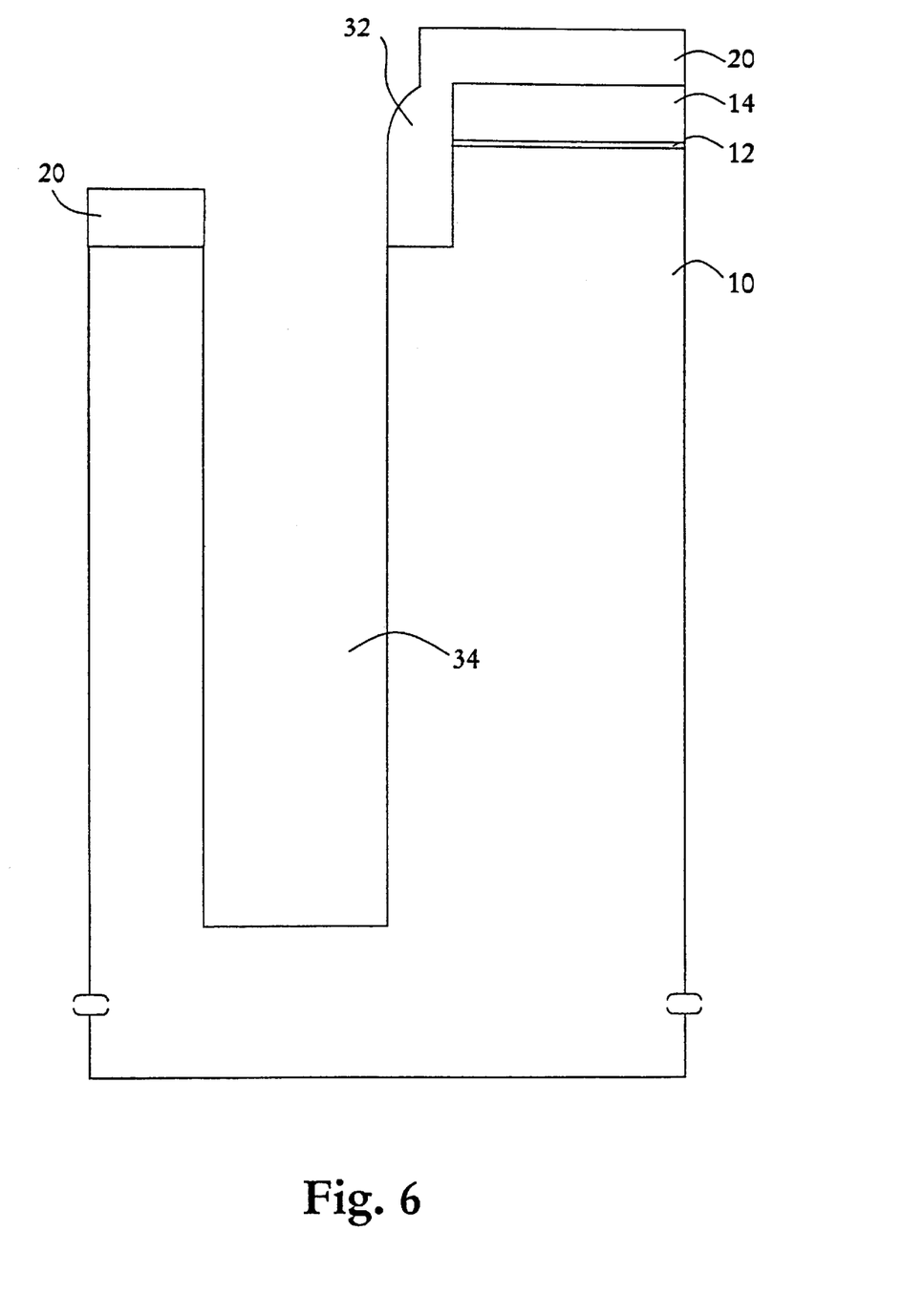

With reference next to FIG. 6, a deep trench 34 is formed by etching, using the oxide layer 20 and the spacer 32 as a hard mask. The oxide spacer 32 of width 2x defines the distance from deep trench 34 to the active area. The depth of the deep trench is at least a few microns, and more preferably at least 5 microns.

Figure 7:
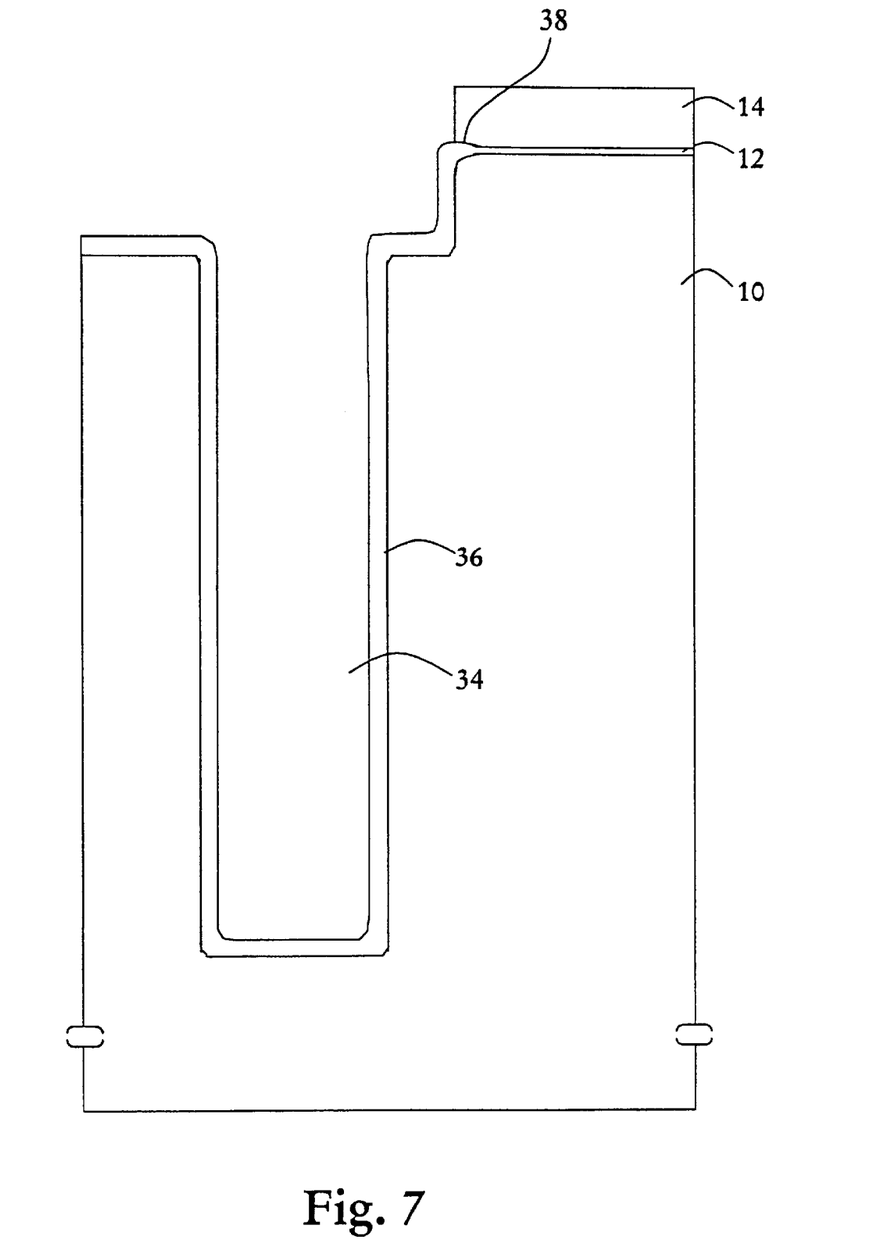

With reference now to FIG. 7, the oxide hard mask 20, 32 for the patterning of the deep trench 32 is removed in e.g. HF.

Subsequent filling and planarization of trench areas can be accomplished in several ways known from the literature. As an illustrative example, the processing is continued by performing a liner oxidation, which purpose is to perform corner rounding at the sharp edge of the trenches, in order to reduce stress and unwanted electrical effects. This is accomplished by growing a thin (200–300 Å) thermal oxide 36 at high temperature (>1000° C.). Since the spacer has been removed, a small "bird's beak" 38 will be formed in the oxide layer 12 under the nitride layer 14, which will further add to the corner rounding, see FIG. 7.

Figure 8:
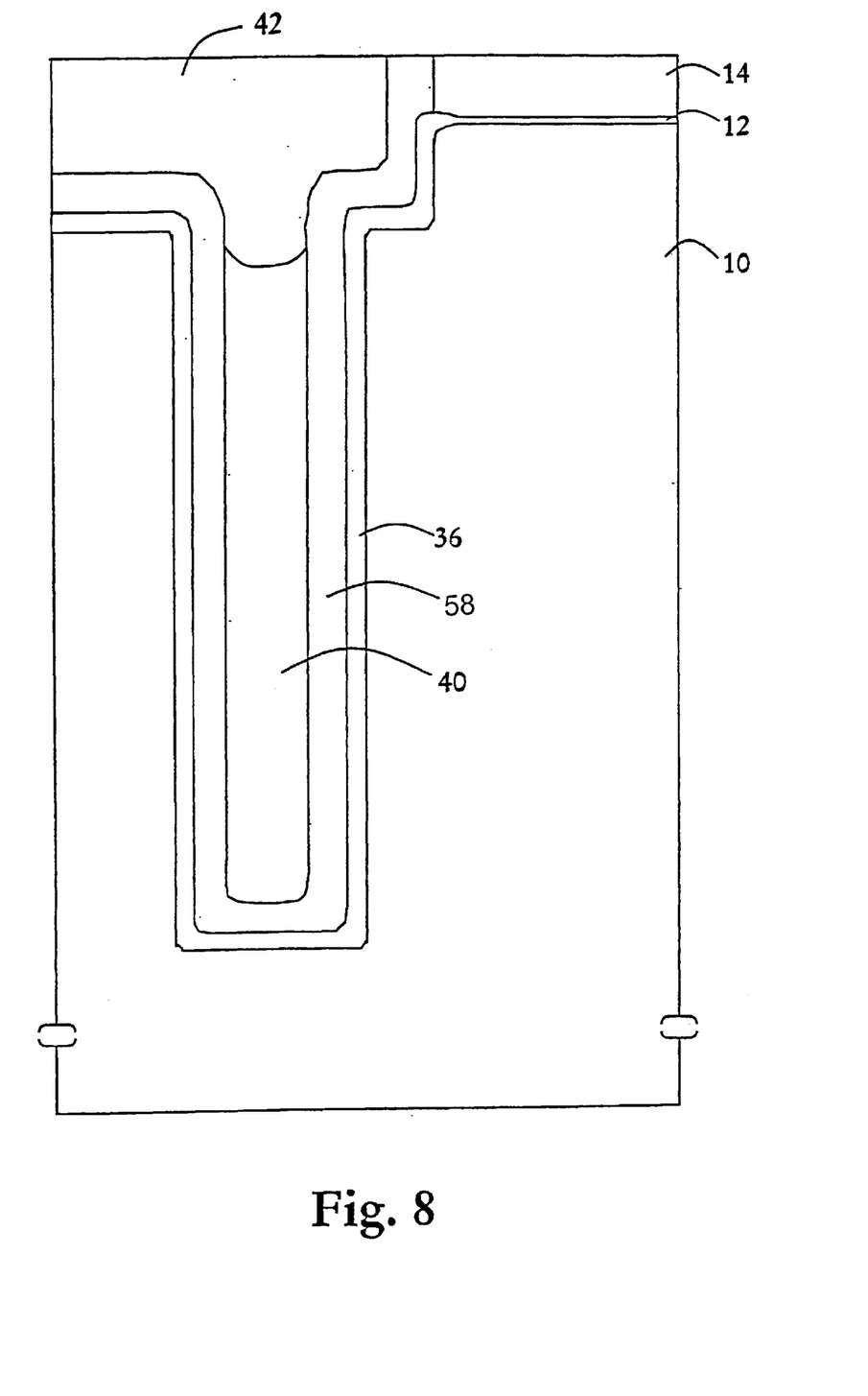

Next, with reference to FIG. 8, the trench is filled in a conventional manner with a 2000 Å thick layer 58 of TEOS and with 15000 Å of polysilicon 40. The polysilicon is then etched back to remove all polysilicon from the shallow trench areas.

Alternatively, the polysilicon is planarized by chemical mechanical polishing before the polysilicon is etched back from the shallow trench areas. Hereby, the recess of the polysilicon fill in the deep trench is reduced. Consequently, a thinner oxide can be deposited in the subsequent step to fill the shallow trench.

Alternatively, a dielectric is used to fill the trenches instead of polysilicon. Finally, the remaining shallow trench is filled with e.g. CVD oxide 42 or a high density plasma (HDP) oxide, and planarized, either by dry etching methods or by chemical mechanical polishing. The resulting structure is shown in FIG. 8. The processing continues further with forming of the active devices etc., which is not shown in the Figures, and will not be further described in this description.

Figure 9:
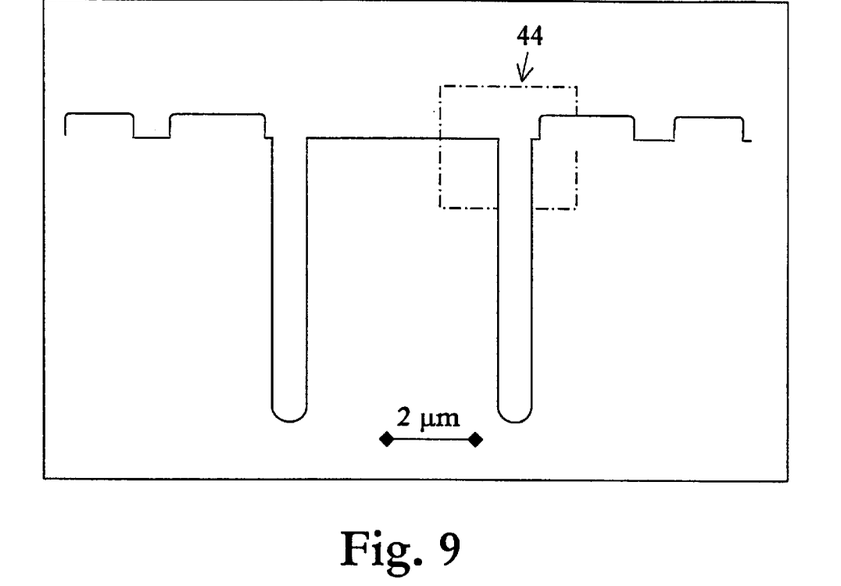
FIGS. 9–11 are SEM images of cross-sections of a portion of a semiconductor structure during processing according to the present invention.
Figure 10:
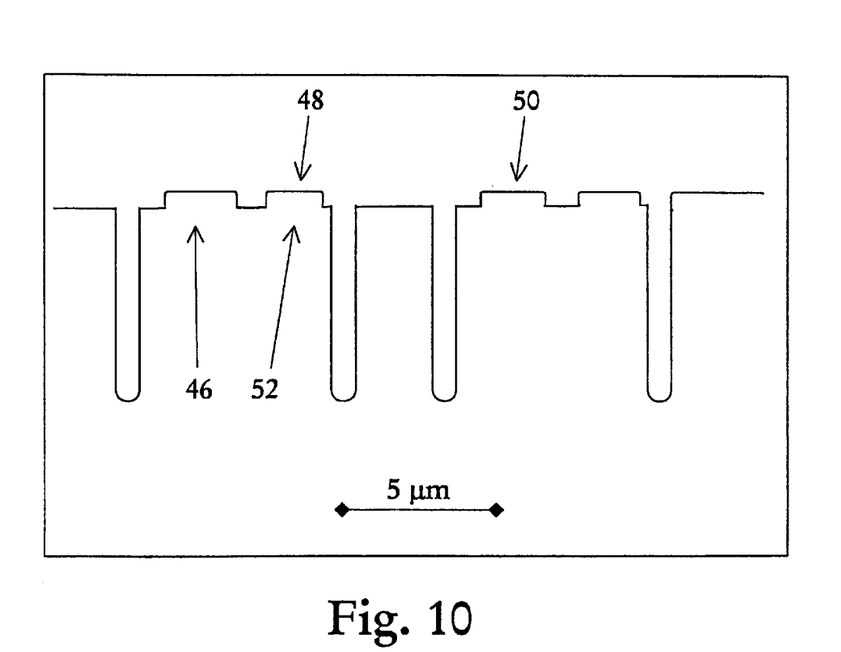
Figure 11:
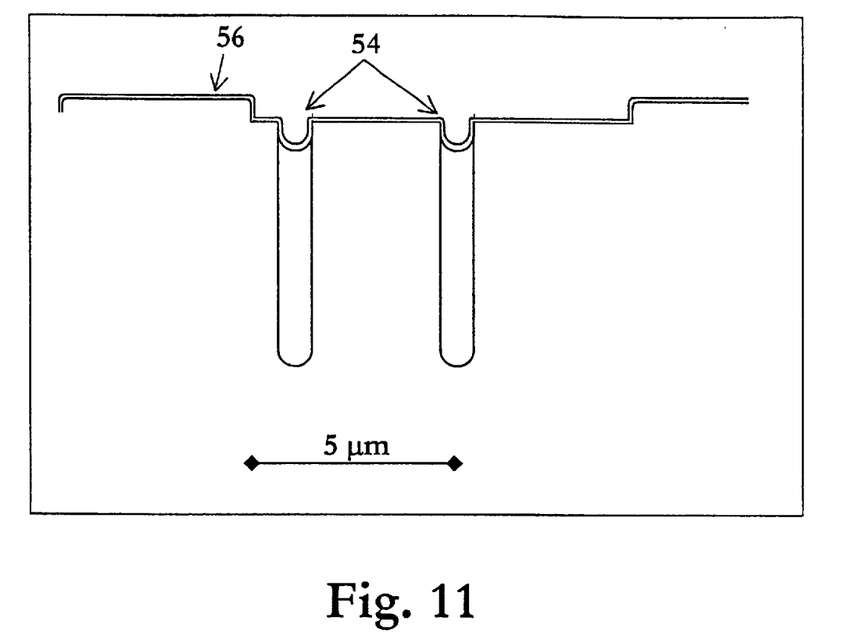

With reference next to FIGS. 9–11, SEM (scanning electron microscope) images of cross-sections of a portion of the semiconductor structure during processing according to the present invention will be briefly discussed.

Structures as obtained prior to trench filling are shown in FIGS. 9 and 10. Note that the oxide/nitride layers on top are not distinctly visible. In FIG. 9 the scanning electron micrograph shows shallow trench areas without any deep trench (left-most and right-most structures) and another shallow trench area with two deep trenches self-aligned to the edges of the shallow trench area (in the middle). The framed area indicated by 44 corresponds to the structure shown in FIGS. 1–3 and 5. In FIG. 10 the micrograph shows device areas 46 for two bipolar transistors 48, 50 as indicated in the Figure, where the deep trench close to the collector contact area 52 is self-aligned to the shallow trench isolation edge.

Finally, FIG. 11 shows a SEM image of the structure subsequent to the back etching when the polysilicon is removed from the shallow trench areas. In the Figure the structures resulting from the etching are indicated by 54 and the 2000 Å thick TEOS layer on top of the nitride/oxide layers and in the trench areas is indicated by 56.

In summary, the present invention uses an additional mask (trench mask) step and makes it compatible with shallow trench isolation, to create a planar surface. Deep trenches may be placed anywhere within shallow trench areas. Furthermore, by forming an oxide spacer at the shallow trench step, the deep trench can be formed self-aligned to the shallow trench. The distance from the deep trench to the active area is controlled by the hard mask oxide thickness. This maximizes packing density and prevents the trench from reaching active areas, which may lead to leakage currents, reduced breakdown voltage or other unwanted effects.

Thus, the present invention exhibits i.a. following advantages:

The STI overlap between deep trench and active device areas (i.e. distance between deep trench edge and shallow trench edge, 2x) is minimized and easily controllable.

The separation of the deep trench from active areas determined by the STI edge is self-aligned and prevents stress arising from deep trench processing to interfere with active areas.

The separation is determined by deep trench hard mask thickness (and possibly combined with STI stack height, i.e. depth of shallow trench).

The trench localization is fixed and determined by the additional mask (trench mask).

The additional mask is positioned on oxide spacer created for hard mask definition to accommodate for any misalignment (spacer width 2x gives an allowable misalignment of +/− x)

Removal of oxide spacer after deep trench etch to allow for simultaneous corner rounding of deep trench and STI close to active area (bird's beak).

It will be obvious that the invention may be varied in a plurality of ways. Such variations are not to be regarded as a departure from the scope of the invention. All such modifications as would be obvious to one skilled in the art are intended to be included within the scope of the appended claims.

What is claimed is:

1. In an integrated circuit, particularly an integrated circuit for radio frequency applications, a semiconductor structure for isolation of semiconductor devices comprised in said circuit, wherein said semiconductor structure comprises a semiconductor substrate;

at least one shallow trench extending vertically into said substrate;

a deep trench laterally located within said shallow trench, said deep trench extending vertically further into said substrate, wherein said deep trench is self aligned to said shallow trench with a controlled lateral distance between an edge of the shallow trench and an edge of the deep trench; and the lateral extensions of the shallow and deep trenches respectively, are independently chosen.

2. The semiconductor structure of claim 1 wherein said deep trench is asymmetrically located with respect to said shallow trench.

3. The semiconductor structure as claimed in claim 1, wherein said controlled lateral distance between an edge of the shallow trench and an edge of the deep trench is between 1000 and 4000 Å;

said lateral extension of said deep trench is about 1 $\mu$m or less; and said lateral extension of said shallow trench is considerably larger than said lateral extension of said deep trench, said lateral extensions being oriented in the same direction.

4. The semiconductor structure as claimed in claim 1, wherein said semiconductor structure comprises a second deep trench located laterally within said shallow trench, said second deep trench extending vertically into said substrate further than said shallow trench, and said second deep trench being self aligned to said shallow trench.

5. The semiconductor structure as claimed in claim 1, wherein said controlled lateral distance between an edge of the shallow trench and an edge of the deep trench is set by a thickness of a conformally deposited dielectric layer during manufacture of the semiconductor structure.

6. The semiconductor structure as claimed in claim 1, wherein said at least one shallow trench and said deep trench are etched structures.

7. The semiconductor structure as claimed in claim 6, wherein said at least one shallow trench and said deep trench are provided with an oxide liner on their bottoms and sidewalls.

8. The semiconductor structure as claimed in claim 7, wherein said at least one shallow trench and said deep trench are provided with an isolation layer on top of said oxide liner.

9. The semiconductor structure as claimed in claim 8, wherein said isolation layer is TEOS layer.

10. The semiconductor structure as claimed is claim 6, wherein said at least one shallow trench and said deep trench are filled with semiconducting or insulating material.

11. The semiconductor structure as claimed in claim 10, wherein the upper surface of said semiconducting or insulating filling material is planarized.

12. The semiconductor structure as claimed in claim 1, wherein said semiconductor substrate is of silicon.

13. The semiconductor structure as claimed in claim 1, wherein said at least one shallow trench extends vertically into said substrate to a depth which is larger than said controlled lateral distance between an edge of the shallow trench and an edge of the deep trench.

14. The semiconductor structure as claimed in claim 1, wherein said at least one shallow trench extends vertically into said substrate to a depth of 0.2–0.7 $\mu$m.

15. The semiconductor structure as claimed in claim 1, wherein said deep trench extends vertically into said substrate to a depth of at least a few microns.

16. In an integrated circuit, particularly an integrated circuit for radio frequency applications, a semiconductor structure for isolation of semiconductor devices comprised in said circuit, wherein said semiconductor structure comprises a semiconductor substrate;

at least one shallow trench extending vertically into said substrate;

a deep trench located laterally within said shallow trench, said deep trench extending vertically further into said substrate, wherein said deep trench is self aligned to said shallow trench with a controlled lateral distance between an edge of the shallow trench and an edge of the deep trench;

the lateral extensions of the shallow and deep trenches, respectively, are independently chosen; and said semiconductor structure comprises a second deep trench located laterally within said shallow trench, said second deep trench extending vertically into said substrate further than said shallow trench.

17. The semiconductor structure as claimed in claim 16, wherein said second deep trench is self aligned to said shallow trench.

18. The semiconductor structure as claimed in claim 16, wherein said controlled lateral distance between an edge of the shallow trench and an edge of the deep trench is between 1000 and 4000 Å said lateral extension of said deep trench is about 1 $\mu$m or less; and said lateral extension of said shallow trench is larger, preferably considerably larger, than said lateral extension of said deep trench, said lateral extensions being oriented in the same direction.

19. In an integrated circuit, particularly an integrated circuit for radio frequency applications, a semiconductor structure for isolation of semiconductor devices comprised in said circuit, wherein said semiconductor structure comprises a semiconductor substrate;

at least one shallow trench extending vertically into said substrate;

a deep trench laterally located within said shallow trench, said deep trench extending vertically further into said substrate, wherein:

said deep trench is self aligned to said shallow trench with a controlled lateral distance between an edge of the shallow trench and an edge of the deep trench, the lateral extensions of the shallow and deep trenches respectively, are independently chosen, and said controlled lateral distance between an edge of the shallow trench and an edge of the deep trench is between 1000 and 4000 Å.

20. The semiconductor structure as claimed in claim 19, wherein said lateral extension of said deep trench is about 1 $\mu$m or less.

* * * * *